United States Patent [19]
Kobayashi et al.

[11] Patent Number: 6,013,162
[45] Date of Patent: Jan. 11, 2000

[54] METHOD OF HANDLING A SUBSTRATE AFTER SPUTTERING AND SPUTTERING APPARATUS

[75] Inventors: Masahiko Kobayashi; Nobuyuki Takahashi, both of Kanagawa, Japan

[73] Assignee: Anelva Corporation, Tokyo, Japan

[21] Appl. No.: 08/859,720

[22] Filed: May 21, 1997

[30] Foreign Application Priority Data

May 21, 1996 [JP] Japan .................................. 8-150042

[51] Int. Cl.$^7$ .................................................. C23C 14/34
[52] U.S. Cl. ................................ 204/298.03; 204/298.09; 204/298.15; 204/298.25; 204/298.26; 204/298.23
[58] Field of Search ........................ 204/298.03, 298.07, 204/298.09, 298.15, 298.23, 298.25, 298.26; 118/719, 724, 725

[56] References Cited

U.S. PATENT DOCUMENTS

| | | | |
|---|---|---|---|
| 4,913,790 | 4/1990 | Narita et al. | 204/298.03 |
| 5,203,958 | 4/1993 | Arai et al. | 204/298.09 |
| 5,267,607 | 12/1993 | Wada | 204/298.09 |
| 5,388,944 | 2/1995 | Takanabe et al. | 204/298.25 |
| 5,460,684 | 10/1995 | Saeki et al. | 204/298.15 |
| 5,707,500 | 1/1998 | Shimamura et al. | 204/298.03 |

FOREIGN PATENT DOCUMENTS 4-141587   5/1992   Japan .

*Primary Examiner*—Rodney McDonald
*Attorney, Agent, or Firm*—Sughrue, Mion, Zinn, Macpeak & Seas, PLLC

[57] ABSTRACT

A substrate which has been heated to a predetermined temperature by a heating unit during sputtering is transferred into an unload-lock chamber having a vacuum pump system and a vent gas introducing system. The unload-lock chamber is provided with a cooling stage which makes surface contact with the substrate so as to forcedly cool the substrate to a predetermined temperature. The substrate is placed on the cooling stage and forcedly cooled. After the substrate is cooled to the predetermined temperature or lower, the vent gas introducing system is operated so that the interior of the unload-lock chamber is returned to the atmospheric pressure ambient. Since the substrate under a high temperature condition does not make contact with the atmospheric pressure ambient, film properties are prevented from being varied.

15 Claims, 8 Drawing Sheets

METHOD OF HANDLING A SUBSTRATE AFTER SPUTTERING AND SPUTTERING APPARATUS

BACKGROUND OF THE INVENTION

1. Field of the Invention

The invention relates to a film deposition technique using sputtering, and particularly to a technique of handling a substrate after sputtering.

2. Description of the Related Art

Film deposition techniques include vacuum evaporation, sputtering, chemical vapor deposition (CVD), and the like. In a process of manufacturing a semiconductor integrated circuit or the like, sputtering is frequently used to deposit a film for a wiring material and the like.

FIG. 12 is a view illustrating the configuration of an example of a conventional sputtering apparatus. The sputtering apparatus of FIG. 12 mainly comprises: a sputter chamber 1 having a vacuum pump system 11; a cathode 12 and a substrate holder 13 which are disposed so as to oppose each other in the sputter chamber 1; a gas introducing system 14 which introduces a gas into the sputter chamber 1; a sputter power source 15 which applies a given voltage to the cathode 12; a load-lock chamber 2 and an unload-lock chamber 3 which are disposed before and after the sputter chamber 1 through gate valves 22 and 32; a transferring mechanism (not shown) which transfers a substrate 10 in the sequence of the load-lock chamber 2, the sputter chamber 1, and the unload-lock chamber 3. The load-lock chamber 2 has a vacuum pump system 201, and the unload-lock chamber 3 has a vacuum pump system 301.

A number of substrates 10 are housed in a substrate cassette 21 and then placed in the load-lock chamber 2. The load-lock chamber 2 is exhausted to a pressure similar to that of the sputter chamber 1, the gate valve 22 is then opened, and one of the substrates 10 is transferred into the sputter chamber 1 and placed on the substrate holder 13.

After the gate valve 22 is closed, the gas introducing system 14 is operated so as to introduce the gas, and the sputter power source 15 is operated, whereby sputtering is conducted so that a thin film is deposited on the substrate 10. In this case, the substrate 10 is heated to a temperature by heating means 131 disposed in the substrate holder 13. For example, it is known that, when sputtering is conducted in a process of forming a tungsten wiring on an Si foundation while heating the substrate to about 400° C., the resistivity of the tungsten thin film is stabilized at a given value. Consequently, sputtering is conducted while heating the substrate 10 to a temperature of this level.

When the thin film is deposited to a desired thickness, the operations of the gas introducing system 14 and the sputter power source 15 are stopped, and the gate valve 32 is then opened. The transferring mechanism takes out the substrate 10 and the taken-out substrate is housed in a substrate cassette 31 disposed in the unload-lock chamber 3. In this case, also the unload-lock chamber 3 is exhausted to a pressure similar to that of the sputter chamber 1.

In this way, the substrates 10 are transferred one by one from the load-lock chamber 2 into the sputter chamber 1, subjected to sputtering, and then housed in the substrate cassette 31 of the unload-lock chamber 3. When all the substrates 10 which have been housed in the substrate cassette 21 of the load-lock chamber 2 are housed in the substrate cassette 31 of the unload-lock chamber 3 after the film deposition, a vent valve 352 is opened so that a vent gas is introduced into the unload-lock chamber 3, thereby returning the interior of the unload-lock chamber 3 to the atmospheric pressure. Thereafter, the substrates 10 are taken out from the unload-lock chamber 3.

One of the important problems raised in film deposition techniques including sputtering is that the film quality is to be stabilized. In an integrated circuit such as an LSI, particularly, even low-degree degradation of the film quality causes circuit characteristics to be changed, so that the performance of a product is largely affected. In sputtering for a wiring material, for example, the resistivity of a film is required to be stabilized at an expected value.

In the above-described conventional sputtering apparatus, it was ascertained that last several ones of the substrates housed in the substrate cassette of the unload-lock chamber are varied in properties such as the resistivity.

The inventors of the invention have vigorously studied the cause of this phenomenon, and found that the phenomenon is caused by exposing a substrate of a high temperature to the ambient atmospheric pressure. Specifically, with respect to last several ones of the substrates housed in the substrate cassette of the unload-lock chamber, the time period from the timing when the substrates are housed in the substrate cassette to that when the unload-lock chamber is ventilated is short. In other words, these substrates are exposed to the ambient atmospheric pressure after a lapse of a relatively short time period from the timing when the substrates are taken out from the sputter chamber under a high temperature condition. Consequently, it seems that the film of a high temperature captures oxygen, water vapor, and the like contained in the vent gas, and this causes the properties to be varied.

SUMMARY OF THE INVENTION

In order to solve the above problem, the invention provides a method of handling a substrate after sputtering, comprising the steps of: depositing a thin film on a substrate while heating the substrate in a vacuum; placing the substrate on a cooling stage so as to forcedly cool the substrate; and returning the substrate to an atmospheric pressure ambient after a temperature of the substrate is lowered to a temperature or lower.

Also, the invention provides a sputtering apparatus comprising: a sputter chamber which has a vacuum pump system and which deposits a thin film on a substrate by means of sputtering; heating means, disposed in the sputter chamber, for heating the substrate to a first temperature during sputtering; an unload-lock chamber which is adjacent to the sputter chamber and which has a vacuum pump system and a vent gas introducing system; and a cooling stage, disposed in the unload-lock chamber, for making surface contact with the substrate which has been subjected to sputtering and taken out from the sputter chamber so as to forcedly cool the substrate to a second temperature.

DETAILED DESCRIPTION OF THE PREFERRED EMBODIMENTS

Hereinafter, embodiments of the invention will be described.

Figure 1:
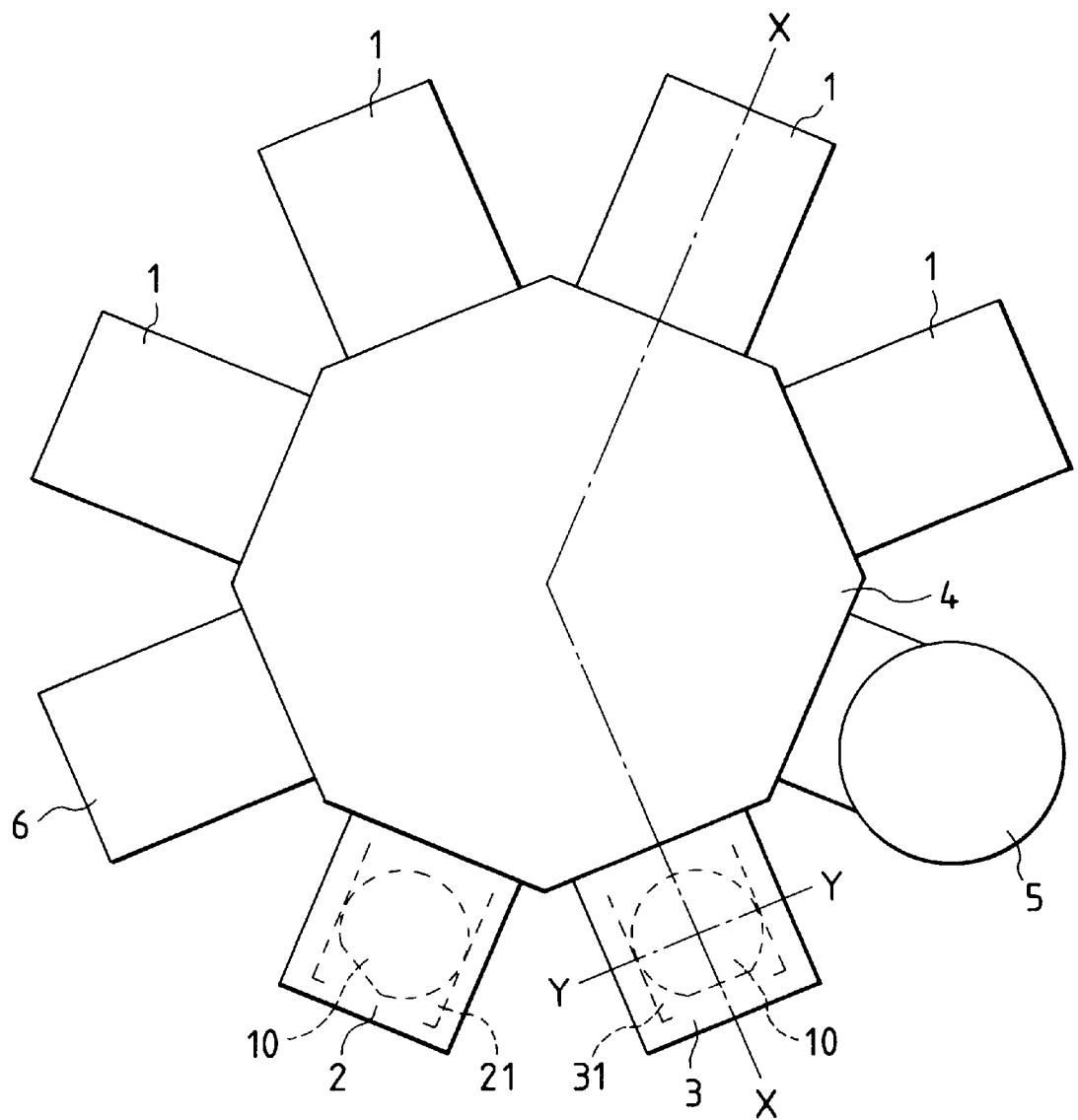
FIG. 1 is a plan view schematically illustrating the configuration of a sputtering apparatus of a first embodiment of the invention.

FIG. 1 is a plan view schematically illustrating the configuration of a sputtering apparatus of a first embodiment of the invention.

As shown in FIG. 1, the sputtering apparatus of the embodiment is configured as a system of the multichamber type which comprises a transfer chamber 4 disposed at the center, and a plurality of chambers arranged around the transfer chamber 4. The surrounding chambers are airtightly connected to the center transfer chamber 4 via respective gate valves which are not shown. Each of the chambers is provided with an exclusive or shared vacuum pump system (not shown in FIG. 1) so as to be exhausted to a desired pressure.

In the transfer chamber 4, a transfer robot 41 which can transfer a substrate in a vacuum is disposed as a transferring mechanism. Among the surrounding chambers, two adjacent chambers are used as a load-lock chamber 2 and an unload-lock chamber 3, respectively. The other surrounding chambers are used as process chambers such as sputter chambers 1, and a preheat chamber 5.

In the apparatus of the embodiment which is a system configured as described above, a constant number (for example, about 25) of substrates 10 on which the film depositing process is to be conducted are housed in a substrate cassette 21, and then placed in the load-lock chamber 2. The substrates 10 are taken out one by one by the transfer robot 41 from the substrate cassette 21 of the load-lock chamber 2 and then sequentially transferred to the process chambers. After conducting various processes including the film depositing process, the substrates are returned to the unload-lock chamber 3. In the unload-lock chamber 3, a substrate cassette 31 is similarly disposed so that a constant number of the substrates 10 which have undergone the processes can be housed in the cassette.

The apparatus of the embodiment is mainly characterized in the unload-lock chamber 3. Therefore, the apparatus will be described with placing stress on the unload-lock chamber 3.

Figure 2:
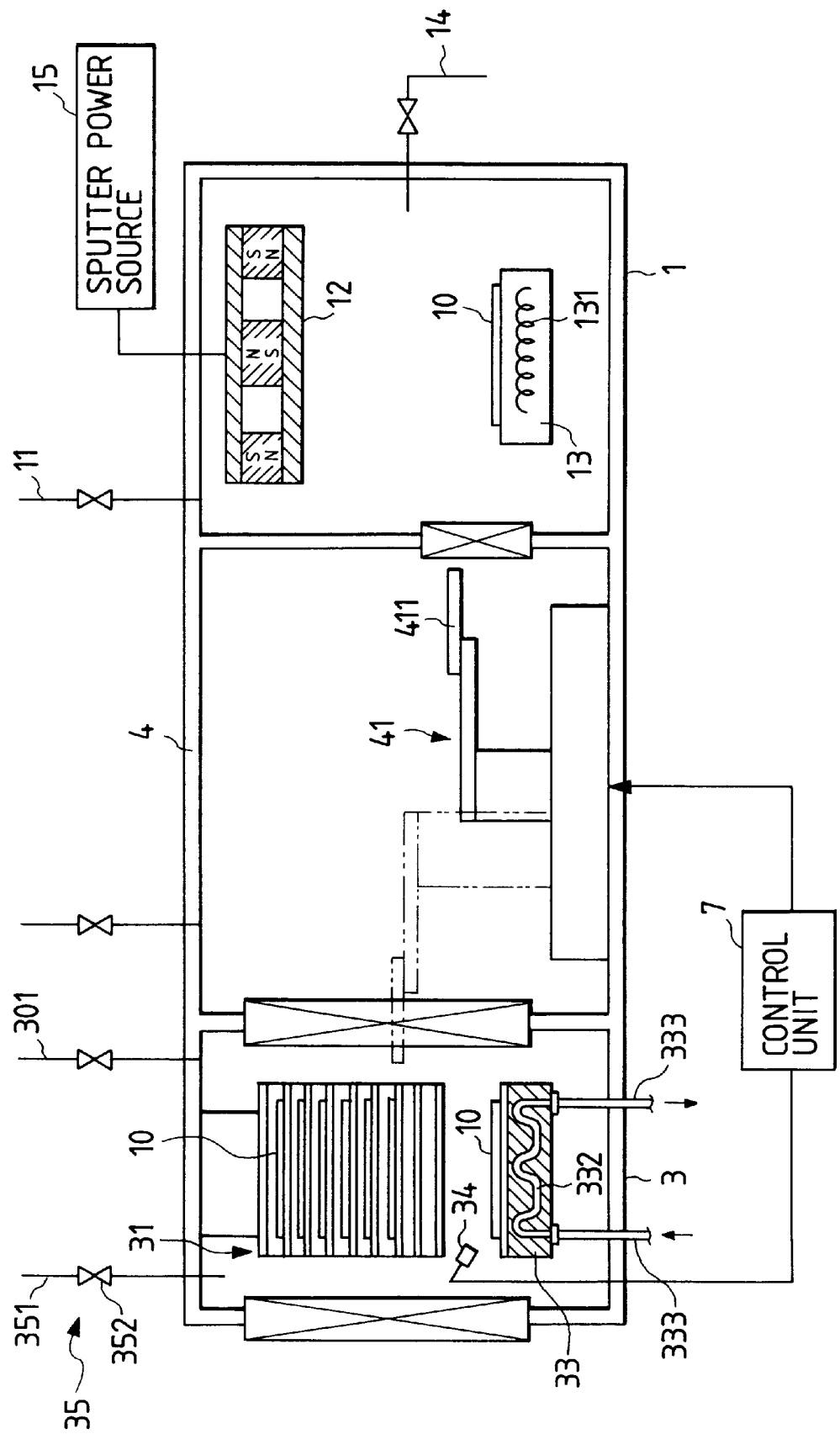
FIG. 2 is a schematic section view of the apparatus taken along the line X—X of FIG. 1.
Figure 3:
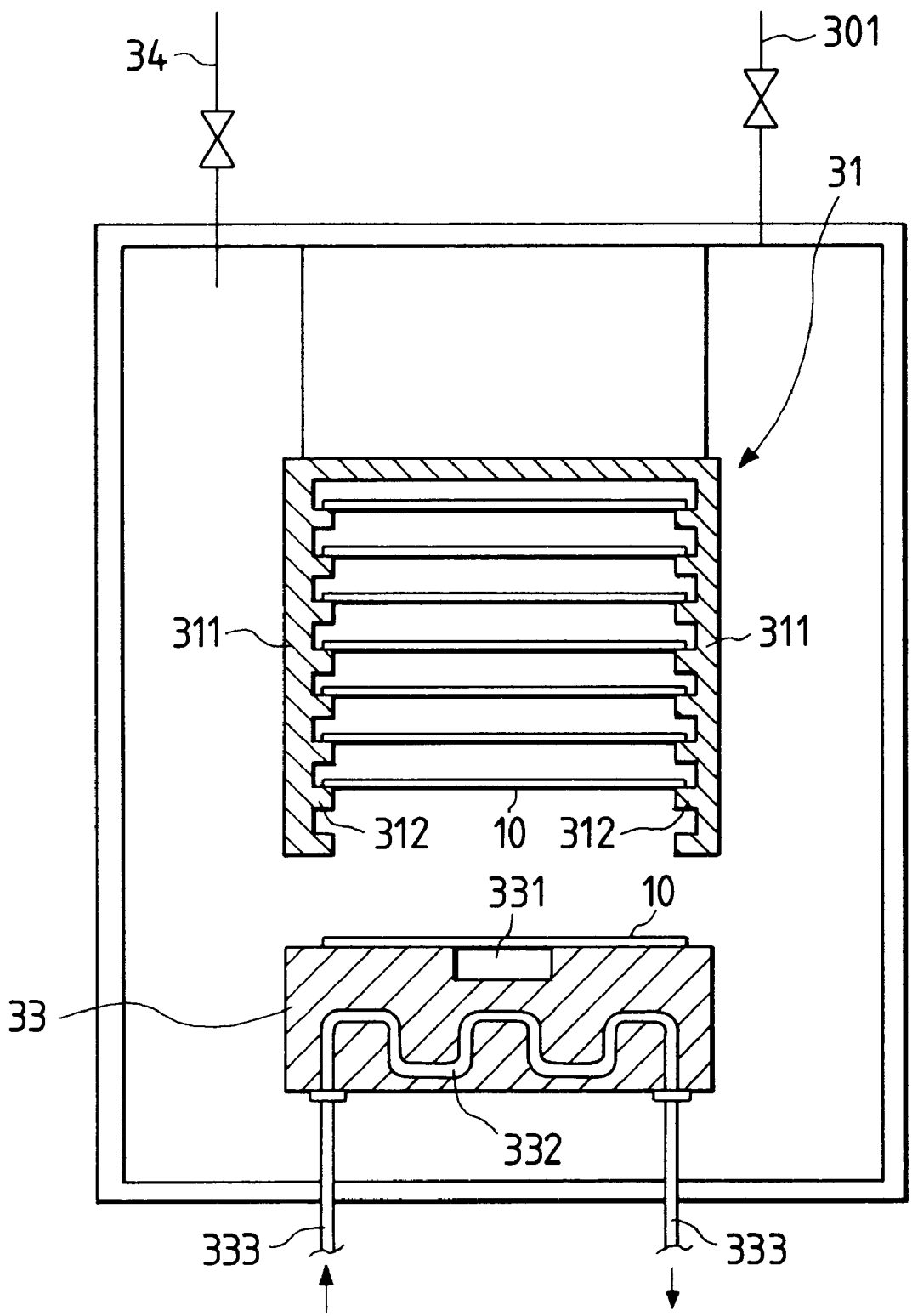
FIG. 3 is a schematic section view of an unload-lock chamber taken along the line Y—Y of FIG. 1.

FIG. 2 is a schematic section view of the apparatus taken along the line X—X of FIG. 1, and FIG. 3 is a schematic section view of the unload-lock chamber taken along the line Y—Y of FIG. 1.

The unload-lock chamber 3 is a vacuum vessel having a vacuum pump system 301 and a vent gas introducing system 35. The vent gas introducing system 35 comprises a vent pipe 351 which is connected to the chamber, and a vent valve 352 which is disposed in the vent pipe 351, and introduces clean air in a clean room as the vent gas. In some cases, special clean air or nitrogen gas is used as the vent gas. In these cases, the vent pipe 351 is connected to a supply source of the gas.

As shown in FIGS. 2 and 3, the recovery substrate cassette 31 is disposed in the unload-lock chamber 3. The substrate cassette 31 can house a number of substrates 10 in a horizontal posture, with vertically arranging them. The cassette has side plates 311 which are respectively disposed on the both sides of the moving direction of an arm 411 of the transfer robot 41. The substrates 10 are supported by projections 312 formed on the opposing inner faces of the side plates 311. The projections 312 elongate in the ambient moving direction of the arm 411 and are vertically arranged in accordance with the positions where the substrates 10 are to be housed.

Figure 4:
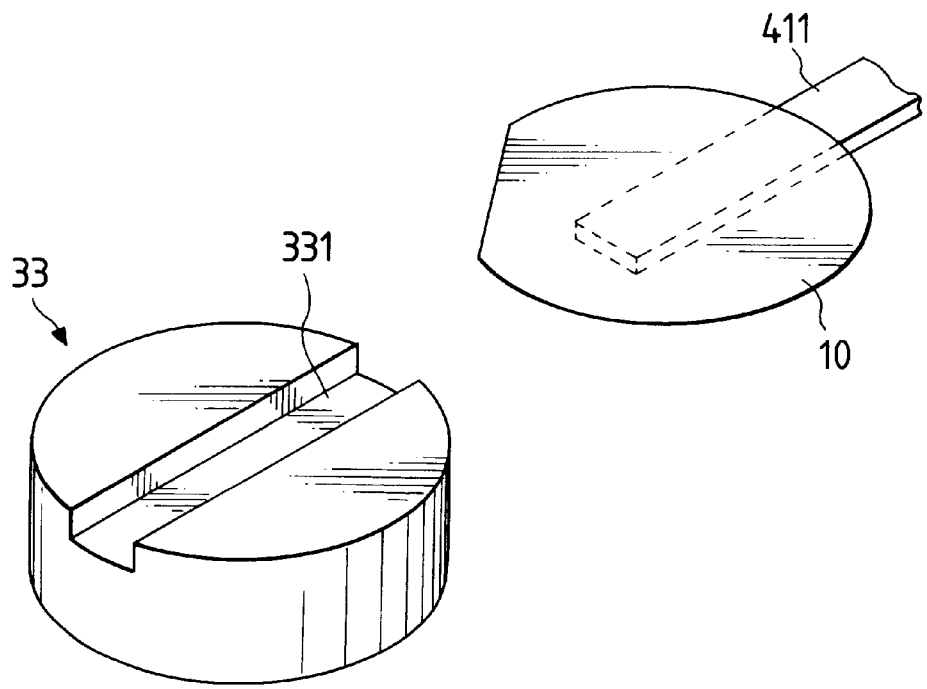
FIG. 4 is a schematic perspective view illustrating the shape of a cooling stage shown in FIG. 2.

A cooling stage 33 is disposed in the unload-lock chamber 3 and below the substrate cassette 31. FIG. 4 is a schematic perspective view illustrating the ambient shape of the cooling stage shown in FIG. 2.

As shown in FIG. 4, the cooling stage 33 in the embodiment is substantially column-shaped as a whole. A groove 331 of a width as shown in FIG. 4 is formed on the 20 upper face on which the substrate 10 is to be placed, so as to elongate in a radial direction. The groove 331 is formed in order to provide "escape" for the arm 411 of the transfer robot 41 during the process of placing the substrate 10. Specifically, when the arm 411 of the transfer robot 41 places a substrate on the cooling stage 33 as shown in FIG. 4, the arm 411 is positioned in the groove 331 of the cooling stage 33.

The cooling stage 33 has a diameter which is slightly larger than that of the substrate 10. Since the embodiment is designed for subjecting the substrate 10 such as a semiconductor wafer which is substantially circular, to a film deposition process, the substantially column-shaped cooling stage 33 is used in the embodiment. When a substrate of another shape, for example, a rectangular substrate such as a glass substrate for a liquid crystal display device is to be subjected to a film deposition process, the cooling stage 33 may be prism-shaped.

As shown in FIGS. 2 and 3, a flow path 332 through which a coolant such as tap water flows is formed in the cooling stage 33. Coolant pipes 333 through which the coolant is supplied and discharged are connected to the inlet and outlet portions of the flow path 332. As required, a circulator (not shown) which circulates the coolant with maintaining the temperature of the coolant to a desired level may be connected to the coolant pipes 333. When tap water or the like is used as the coolant, however, the water may be wasted as it is.

According to this configuration, the cooling stage 33 can cool the substrate 10 to a desired temperature or lower. In the case where the substrate 10 is once heated to about 200 to 400° C. and then transferred to the unload-lock chamber 3, for example, the temperature is set to be about 100 to 150° C. More specifically, when a TiN film is deposited as a barrier metal, the substrate is cooled to 100° C. or lower, and, when a W film is deposited as wiring for a channel of an FET, the substrate is cooled to 150° C. or lower.

Preferably, the cooling stage 33 is made of a material which is excellent in thermal conductivity, such as copper (pure copper) or aluminum. In the case where surface corrosion or the like becomes a problem, the surface may be preferably covered by depositing a protection film or sticking a plate member such as a stainless steel plate to the surface by vacuum brazing or the like.

The apparatus of the embodiment further comprises a noncontact thermometer 34 which measures the temperature of the substrate 10 on the cooling stage 33 in a noncontact manner. A radiation thermometer such as a thermopile thermometer may be preferably used as the noncontact thermometer. The emissivity is varied depending on the surface state of the substrate 10. Therefore, it is preferable to previously obtain the emissivity of the substrate 10 and correct the value indicated by the noncontact thermometer 34 in accordance with the emissivity. Specifically, the temperature of another substrate having the same surface state as that of the substrate 10 the temperature of which is to be measured is previously measured by another method, and the radiant flux from the substrate is compared with that of black body radiation of the same temperature, thereby obtaining the emissivity. The data measured by the noncontact thermometer 34 are sent to a control unit 7 which controls the operation of the whole apparatus.

Referring to FIGS. 1 and 2, other portions of the sputtering apparatus of the embodiment will be briefly described.

The load-lock chamber 2 which is adjacent to the unload-lock chamber 3 functions as an inlet for transferring the substrate 10 into the apparatus. The supply substrate cassette 21 is disposed in the chamber. The substrate cassette 21 is configured in the same manner as the above-described substrate cassette 31 of the unload-lock chamber 3. The load-lock chamber 2 is provided with a vent gas introducing system (not shown) which is identical with the vent gas introducing system 35 of the unload-lock chamber 3.

An automatic loading mechanism which is not shown is disposed outside the load-lock chamber 2. The automatic loading mechanism is used for automatically loading the substrates 10 into the substrate cassette 21 of the load-lock chamber 2, and comprises a loading robot for causing the substrates 10 accommodated in a carrier cassette configured in the same manner as the substrate cassette 21, to be housed one by one into the substrate cassette 21. An automatic unloading mechanism which is not shown is disposed outside the unload-lock chamber 3 so as to automatically recover the substrates from the unload-lock chamber 3 into the carrier cassette.

Figure 12:
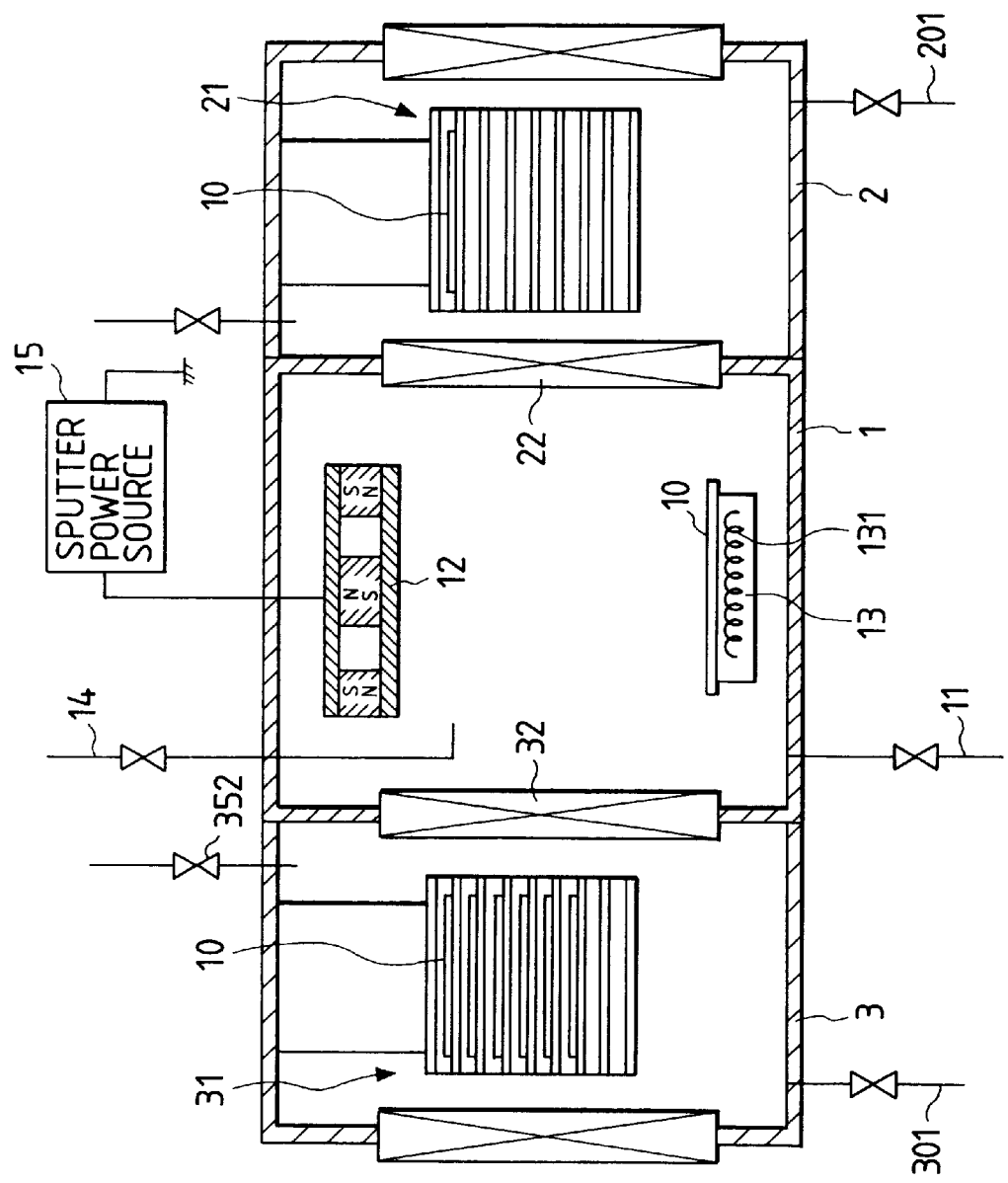
FIG. 12 is a view illustrating the configuration of an example of a conventional sputtering apparatus.

The sputter chambers 1 are configured in a substantially same manner as the conventional sputter chamber shown in FIG. 12. Namely, each of the sputter chambers comprises a cathode 12 and a substrate holder 13 which are disposed so as to oppose each other, a sputter power source 15, and a gas introducing system 14. The substrate holder 13 incorporates heating means 131 so as to heat the substrate 10 to about 100 to 500° C. during the process of film deposition.

Among the process chambers, about three chambers are configured as the sputter chambers 1. The other process chambers are configured as the preheat chamber 5, an etching chamber 6, etc.

The preheat chamber 5 is a process chamber in which, in order to conduct a degassing process and the like on the substrate 10 prior to sputtering, the substrate 10 is heated to about 200 to 550° C. This heating is executed by placing the substrate 10 on a heating stage incorporating heating means of the resistance heating type or the heating medium circulating type.

The etching chamber 6 is a process chamber in which a native oxide film and the like on the surface of the substrate 10 are etched away prior to sputtering. Various configurations may be used for performing the etching. For example, used is a configuration in which a high-frequency discharge or the like is caused in a gas such as argon to generate a plasma and a bias voltage is applied to the substrate 10, thereby subjecting the surface of the substrate 10 to sputter etching.

The transfer robot 41 which is disposed in the transfer chamber 4 and functions as a transferring mechanism is configured so as to transfer the substrate 10 while supporting the substrate on the upper face of the arm 411. The arm 411 of the transfer robot 41 can make a horizontal linear movement, a vertical movement, and a rotational movement about a vertical axis while electrostatically attracts and holds the substrate 10.

As described above, the sputtering apparatus of the embodiment has the control unit 7 which controls the operation of the whole apparatus. The control unit 7 controls also the operation of the transfer robot 41 in the manner described later.

Hereinafter, description of the operation of the thus configured sputtering apparatus will be given. In the following description, a sputtering process for forming wiring for a channel of a MOS-FET will be described as an example.

First, the automatic loading mechanism loads a constant number of substrates 10 into the substrate cassette 21 of the load-lock chamber 2, the gate valve of the inlet is closed, and the load-lock chamber 2 is then exhausted to a desired pressure. Next, a gate valve (not shown) on the side of the transfer chamber 4 is opened, and the transfer robot 41 takes out one of the substrates 10 from the substrate cassette 21 and transfers the substrate to the preheat chamber 5. In the preheat chamber 5, heating processing is conducted so as to degas the substrate, and the substrate 10 is then transferred to the etching chamber 6.

The substrate 10 is subjected to etching in the etching chamber 6 so that a native oxide film and the like on the surface are etched away. Thereafter, the substrate is transferred to the sputter chamber 1 in which predetermined sputtering is conducted. During this process, the substrate 10 is heated to a desired temperature. When a tungsten thin film is to be deposited as wiring as described above, for example, the substrate 10 is heated to about 400° C. so that the resistivity is stabilized. In film deposition for forming aluminum wiring in a fine hole such as a contact hole, the substrate 10 may be heated to about 400° C. so that aluminum slightly flows (fuses), thereby enhancing the step covering property for the interior of the contact hole.

After the thin film is deposited in the sputter chamber 1, the substrate 10 is transferred to the unload-lock chamber 3, and then housed in the substrate cassette 31. In this way, the substrates 10 are taken out one by one by the transfer robot 41 from the load-lock chamber 2, sequentially transferred to the process chambers to be subjected-to sputtering, and recovered to the unload-lock chamber 3. When all the substrates 10 which have been housed in the substrate cassette 21 of the load-lock chamber 2 are recovered into the substrate cassette 31 of the unload-lock chamber 3, the vent gas introducing system 35 of the unload-lock chamber 3 is operated so that the interior of the unload-lock chamber 3 is returned to the atmospheric pressure. Thereafter, a gate valve (not shown) is opened, and the automatic unloading mechanism recovers the substrates 10 into the carrier cassette.

During the above-mentioned operations, the control unit 7 sends a control signal to the transfer robot 41 so that the last several substrates 10 when the number of the substrates 10 recovered in the substrate cassette 31 of the unload-lock chamber 3 reached the fixed one are transferred by way of placement on the cooling stage 33. For example, the transfer robot 41 operates in the following manner. With respect to each of the last two substrates 10, the substrate is placed on the cooling stage 33 and this state is maintained for a given time period. When the temperature of the substrate 10 is lowered to a desired temperature or lower, the substrate is removed away from the cooling stage 33, and then housed into the substrate cassette 31. During this process, the temperature of the substrate 10 is measured by the noncontact thermometer 34. After it is judged from the measurement data of the noncontact thermometer 34 that the temperature of the substrate 10 is lowered to the desired temperature or lower, the control unit 7 controls the transfer robot 41 so as to remove away the substrate 10 from the cooling stage 33.

As a result of this cooling of the substrates 10, at the timing when the unload-lock chamber 3 is ventilated, the temperatures of all the substrates 10 in the substrate cassette 31 are lowered to a desired temperature or lower. Therefore, instability of properties of the resulting film such as variation of the resistivity which has been observed in the conventional apparatus is prevented from occurring. With respect to the time period when the substrate 10 is placed on the cooling stage 33, a time period sufficient for surely lowering the temperature to the fixed one is previously obtained from the cooling capacity of the cooling stage 33 and the like, and a sequential control may be conducted so that the substrate 10 is placed on the cooling stage 33 for the obtained time period.

The thus configured apparatus of the embodiment conducts single wafer processing on the substrates 10 while transferring them in a cassette-to-cassette manner. Therefore, thin films of an excellent quality can be obtained with high productivity. During this process, the placing operation on the cooling stage 33 is not conducted on all the substrates 10 but only on the several substrates 10 when the number of transferred substrates reaches the fixed one. Consequently, the cooling operation does not cause the whole processing time period to be prolonged, thereby preventing the productivity from being impaired. The number of substrates on which the placing operation is to be conducted depends on factors such as the heating temperature of the substrates 10 during sputtering, the kind of the film, the time period from the recovery of the last substrate 10 to the ventilating operation, and the like. Therefore, the number is suitably decided in consideration of these factors.

The measurement data of the noncontact thermometer 34 may be used in the following manner, in place of the above-described control of the timing of removing the substrate 10 from the cooling stage 33. Namely, the time period when the substrate 10 is placed on the cooling stage 33 is previously decided, a sequential control is then conducted, and the temperature of the substrate 10 when the substrate is removed from the cooling stage 33 is monitored to check whether the temperature is lowered to the desired temperature or lower.

Next, other embodiments of the invention will be described. The apparatuses of the embodiments described below are identical with the embodiment described above except the configuration of the cooling stage 33.

Figure 5:
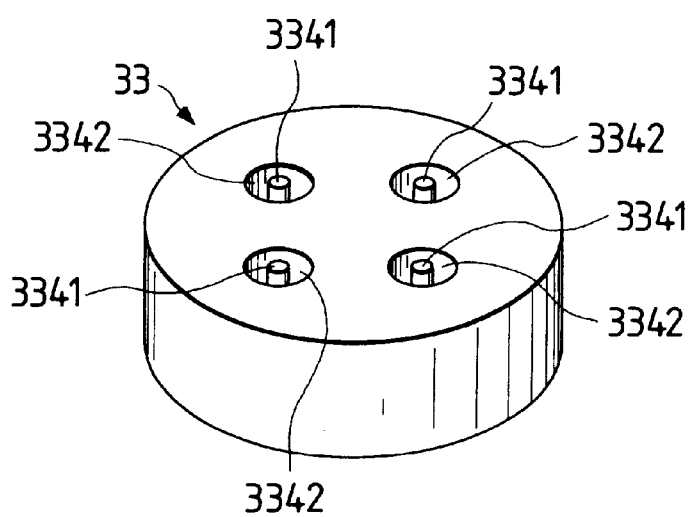
FIG. 5 is a schematic perspective view illustrating the configuration of a cooling stage used in a sputtering apparatus of a second embodiment of the invention.

FIG. 5 is a schematic perspective view illustrating the configuration of a cooling stage used in a sputtering apparatus of a second embodiment of the invention. In this embodiment, the groove 331 such as shown in FIG. 4 is not formed in the cooling stage 33, and instead the cooling stage incorporates substrate receiving pins 3341. Specifically, four pinholes 3342 which vertically pass through the column-shaped cooling stage 33 are formed at positions symmetrical about the center. The substrate receiving pins 3341 pass through the pinholes 3342, respectively. An elevating mechanism (not shown) which elevates the substrate receiving pins 3341 is also disposed.

In the embodiment shown in FIG. 5, when the substrate 10 is to be placed on the cooling stage 33 by the arm 411 of the transfer robot 41, the elevating mechanism for the substrate receiving pins 3341 is driven so as to elevate the substrate receiving pins 3341 to a level above the upper face of the cooling stage 33. Thereafter, the arm 411 is moved into the space between the four substrate receiving pins 3341 and then lowered so that the substrate 10 is placed on the substrate receiving pins 3341. The arm 411 is retracted, and the elevating mechanism lowers the substrate receiving pins 3341, so that the substrate 10 is placed on the cooling stage 33.

In the second embodiment, the area of the face of the cooling stage 33 making contact with a substrate is larger than that of the first embodiment. Consequently, the cooling efficiency is improved and a substrate can be cooled to the desired temperature for a shorter time period, thereby improving the productivity. There is a possibility that, when the elevating mechanism is driven, dust particles are generated. Therefore, the elevating mechanism is preferably disposed outside the unload-lock chamber 3, i.e., in the side of the atmospheric pressure.

Figure 6:
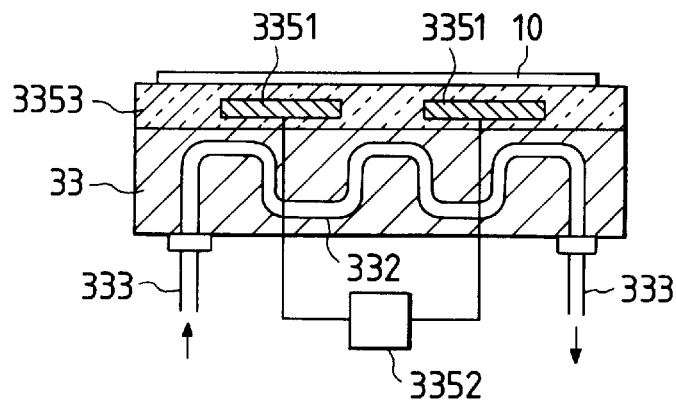
FIG. 6 is a schematic section view illustrating the configuration of a cooling stage used in a sputtering apparatus of a third embodiment of the invention.

FIG. 6 is a schematic section view illustrating the configuration of a cooling stage used in a sputtering apparatus of a third embodiment of the invention. In the third embodiment, an electrostatic chucking mechanism is disposed in order to enhance the surface contact between the substrate 10 and the cooling stage 33. Specifically, a dielectric block 3353 is connected to the substrate-placing face of the cooling stage 33 so as to exhibit excellent heat conductivity. A pair of chucking electrodes 3351 are embedded in the dielectric block 3353. An chucking power source 3352 which applies a voltage to the chucking electrodes 3351 is connected to the chucking electrodes 3351. In order to protect the surface and adjust the dielectric constant, a dielectric film (not shown) which is made of aluminum nitride or the like and has a thickness of about 5 to 10 $\mu$m is formed on the upper face of the dielectric block 3353. In order to prevent the thermal conductivity from largely lowering, preferably, the thicknesses of the dielectric block 3353 and the dielectric film are set to be as small as possible in the range where a required chucking effect is attained.

According to the third embodiment, since the surface contact between the substrate 10 and the cooling stage 33 is enhanced, the cooling efficiency is improved, with the result that the time period required for cooling can be shortened.

Figure 7:
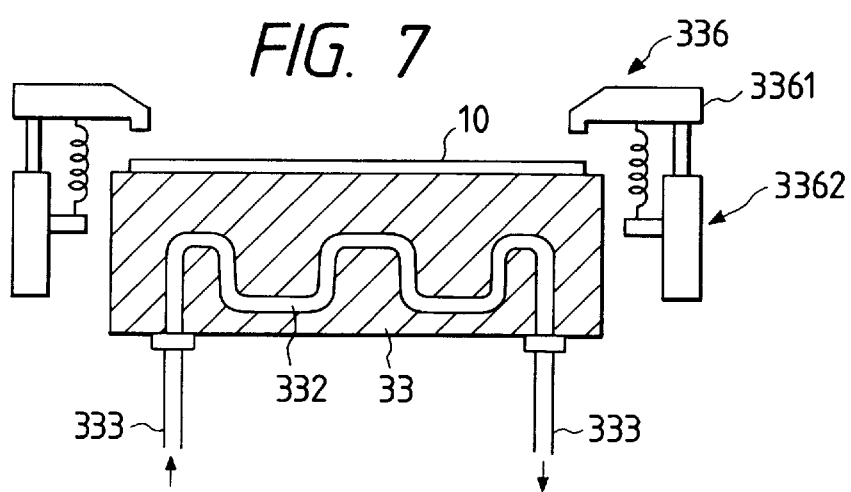
FIG. 7 is a schematic section view illustrating the configuration of a cooling stage used in a sputtering apparatus of a fourth embodiment of the invention.

FIG. 7 is a section view schematically illustrating the configuration of a cooling stage used in a sputtering apparatus of a fourth embodiment of the invention. In the fourth embodiment, a mechanically clamping mechanism 336 which presses the substrate 10 against the cooling stage 33 is disposed so as to enhance the surface contact between the substrate 10 and the cooling stage 33.

The clamping mechanism 336 comprises an annular clamper 3361 of a size corresponding to the outer diameter of the substrate 10, and a driving mechanism 3362 which drives the clamper 3361. The driving mechanism 3362 comprises a spring which exerts an elastic force to the cooling stage 33, and a push rod which pushes up the clamper 3361 against the force of the spring.

When the arm 411 of the transfer robot 41 places the substrate 10 on the cooling stage 33, the driving mechanism 3362 downward moves the clamper 3361 so that the clamper is placed on the periphery of the substrate 10. This enhances the surface contact between the substrate 10 and the cooling stage 33, thereby improving the cooling efficiency. The clamper 3361 is configured so as to press the margin portion in the periphery of the substrate 10 where no circuit is to be formed.

Figure 8:
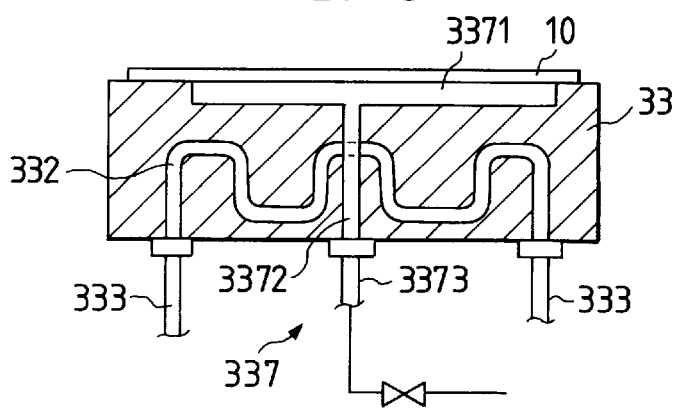
FIG. 8 is a schematic section view illustrating the configuration of a cooling stage used in a sputtering apparatus of a fifth embodiment of the invention.

FIG. 8 is a section view schematically illustrating the configuration of a cooling stage used in a sputtering apparatus of a fifth embodiment of the invention.

In this embodiment, the cooling stage 33 comprises cooling gas introducing means 337 for introducing a cooling gas with causing the cooling gas to make contact with the rear face of the substrate 10. A groove or recess 3371 into which the cooling gas is to be introduced is formed in the upper face of the cooling stage 33. A communication hole 3372 which communicates with the groove or recess 3371 is passed through the cooling stage 33. A pipe 3373 for supplying the cooling gas is connected to the communication hole 3372. The groove or recess 3371 in the upper face of the cooling stage 33 is formed in such a manner that, when the substrate 10 is placed on the cooling stage, the groove or recess is closed by the substrate 10.

The cooling gas which is introduced into the groove or recess 3371 through the communication hole 3372 makes contact with the rear face of the substrate 10 to exchange heat, and satisfactorily transmits heat to the cooling stage 33. As a result, the efficiency of the operation of cooling the substrate 10 exerted by the cooling stage 33 is improved and the time period required for the cooling operation can be shortened. When the rear face of the substrate 10 fails to make complete surface contact with the upper face of the cooling stage 33, and a small gap portion is formed between them, the heat transfer by conduction cannot be attained with respect to the gap portion because of the vacuum environment, and the heat transfer is attained only by radiation. In contrast, when a cooling gas is introduced as in the case of the embodiment, convection and the like occur so that the cooling gas transfers the heat of the substrate 10, thereby improving the cooling efficiency.

As the cooling gas, a rare gas or an inert gas such as argon, nitrogen, or helium is preferably used. The pressure of the cooling gas under the state where the gas is introduced into the groove or recess 3371 is, for example, about 10 Torr. The cooling gas at room temperature may be used. When the cooling gas at a temperature lower than room temperature is used, however, the effect is further enhanced.

As seen from the embodiment, in the invention, the surface contact of the substrate with the cooling stage includes both the contact with the surface of the cooling stage, and that with a fluid such as the cooling gas. In other words, it means that heat conduction is attained by the contact of the rear face of the substrate, thereby realizing forced cooling.

Next, examples of the embodiments of the invention will be described.

The inventors produced three cooling stages A, B, and C shown in Table 1 below, and measured time periods required for cooling. The three cooling stages were configured in the same manner as that of the first embodiment.

TABLE 1

| Cooling Stage | Temperature of Cooling Stage | Electrostatic Chucking Mechanism | Cooling Gas Introducing Means |
| --- | --- | --- | --- |
| A | 25 to 30° C. | not provided | not provided |
| B | " | provided | not provided |
| C | " | provided | provided |

In each of the cooling stages A, B, and C, the time period required for cooling a substrate which had been heated to 400° C., to 150° C. was measured. In the cooling stage A, the time period was 90 seconds; in the cooling stage B, it was 60 seconds; and, in the cooling stage C, it was 45 seconds.

In order to compare the invention with the conventional technique, an experiment was conducted in the following manner.

Figure 9:
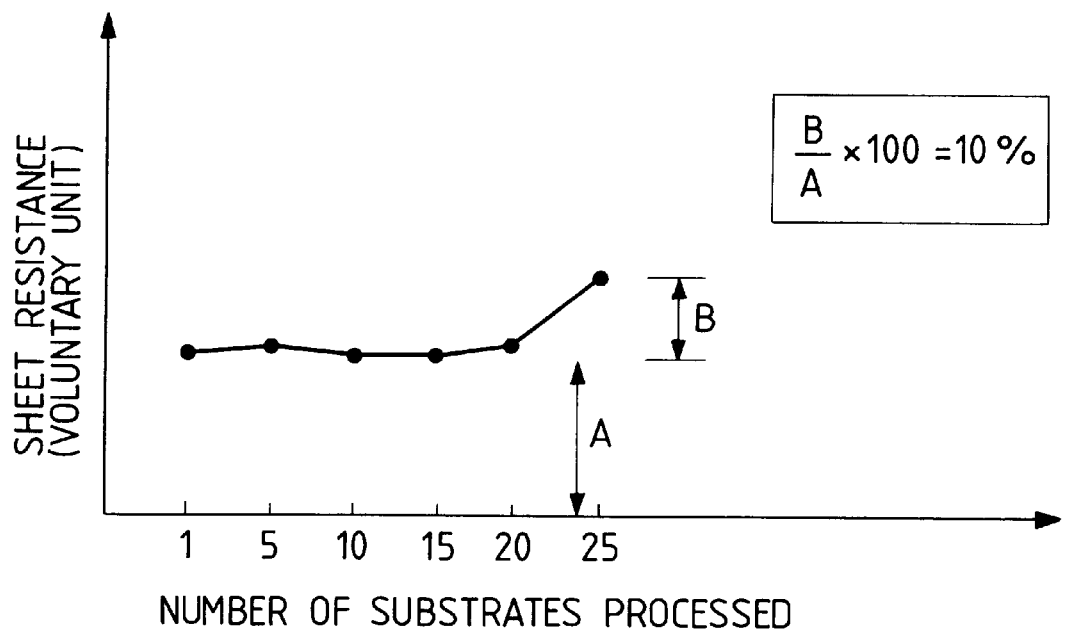
FIG. 9 is a graph showing results of measurements of the sheet resistance of a film deposited by using a conventional sputtering apparatus.

In a conventional sputtering apparatus or an apparatus in which the unload-lock chamber 3 is not provided with a cooling stage, 25 substrates were sequentially subjected to the deposition of a TiN film and recovered into the substrate cassette 31 of the unload-lock chamber 3. During the film deposition, the substrate temperature was 400° C. At the timing when 90 seconds elapsed from the recovery, the unload-lock chamber 3 was ventilated so as to return the interior of the chamber to the atmospheric pressure, and the substrates were then taken out. Then, the sheet resistance of the film of each substrate was measured. FIG. 9 shows the results of the measurements.

Figure 10:
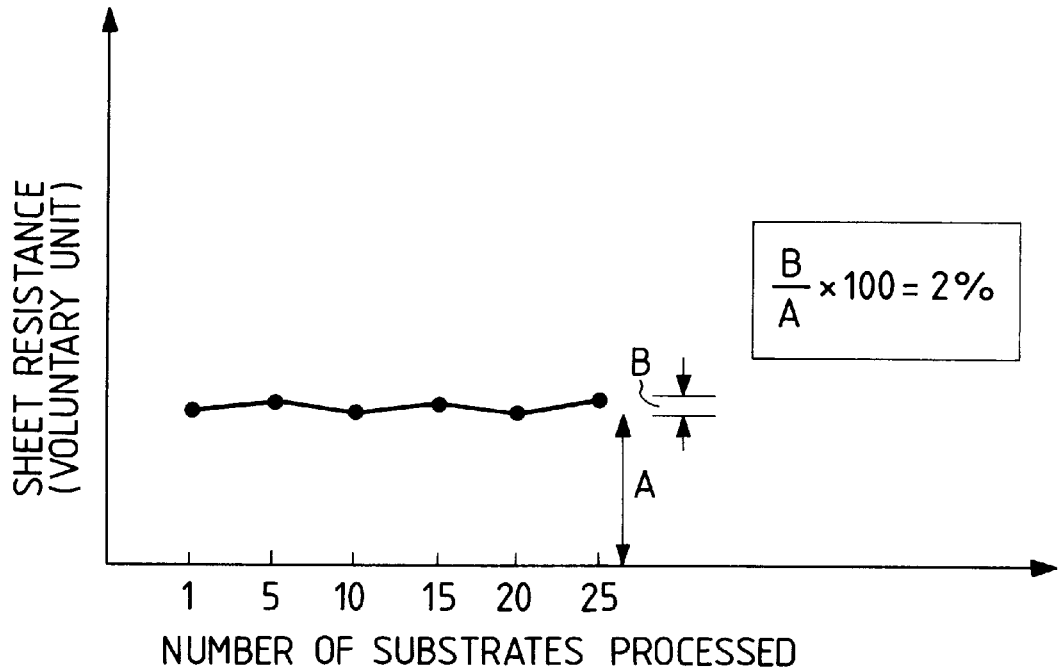
FIG. 10 is a graph showing results of measurements of the sheet resistance of a film deposited by using a sputtering apparatus of an example of the invention.

In a sputtering apparatus of an example of the invention or an apparatus in which the cooling stage A is disposed in the unload-lock chamber 3, similarly, 25 substrates were sequentially subjected to the deposition of a TiN film under the condition that the substrate temperature was 400° C., and recovered into the substrate cassette 31 of the unload-lock chamber 3. In this recovery, with respect to the 24th and 25th substrates (the last two substrates), each of the substrates was once placed on the cooling stage to be cooled to 150° C. and then recovered into the substrate cassette 31. As described above, the time period when the substrates were placed on the cooling stage was 90 seconds. Then, the sheet resistance of the film of each substrate was similarly measured. FIG. 10 shows the results of the measurements.

As shown in FIG. 9, in the case where the conventional apparatus was used, with respect to the 20th and following substrates, the sheet resistance was gradually raised, and that of the 25th substrate was higher by about 10% than that of the 1st to 20th substrates. In contrast, as shown in FIG. 10, in the case where the apparatus of the example was used, the variation of the sheet resistance of the 1st to 25th substrates was suppressed to about 2% or less and the resistance was substantially constant or stabilized. In addition, the cooling stage B was used and the cooling operation was similarly conducted with setting the cooling time period to be 60 seconds. Also in this case, it was seen that the variation of the sheet resistance of the substrates was suppressed to about 2% as shown in FIG. 10 and the resistance was stabilized.

From these results, according to the configuration of the invention in which a cooling stage is disposed in an unload-lock chamber and substrates are once cooled and then returned to an atmospheric pressure ambient, variation in the film quality which has been conventionally observed is not caused and stabilized film properties can be obtained in all substrates. It seems that the stabilization of the film properties is obtained by the phenomenon that, as described above, substrates under a high temperature condition are not exposed to the atmospheric pressure ambient and hence do not capture oxygen, water vapor, and the like contained in the atmosphere. For example, a composition analysis of the above-described TiN film showed that, with respect to the substrates shown in FIG. 9 in which the resistivity was increased, oxygen was detected in addition to titanium and nitrogen. Therefore, it seems that a TiON film or the like is deposited in the surface layer of the TiN film.

Figure 11:
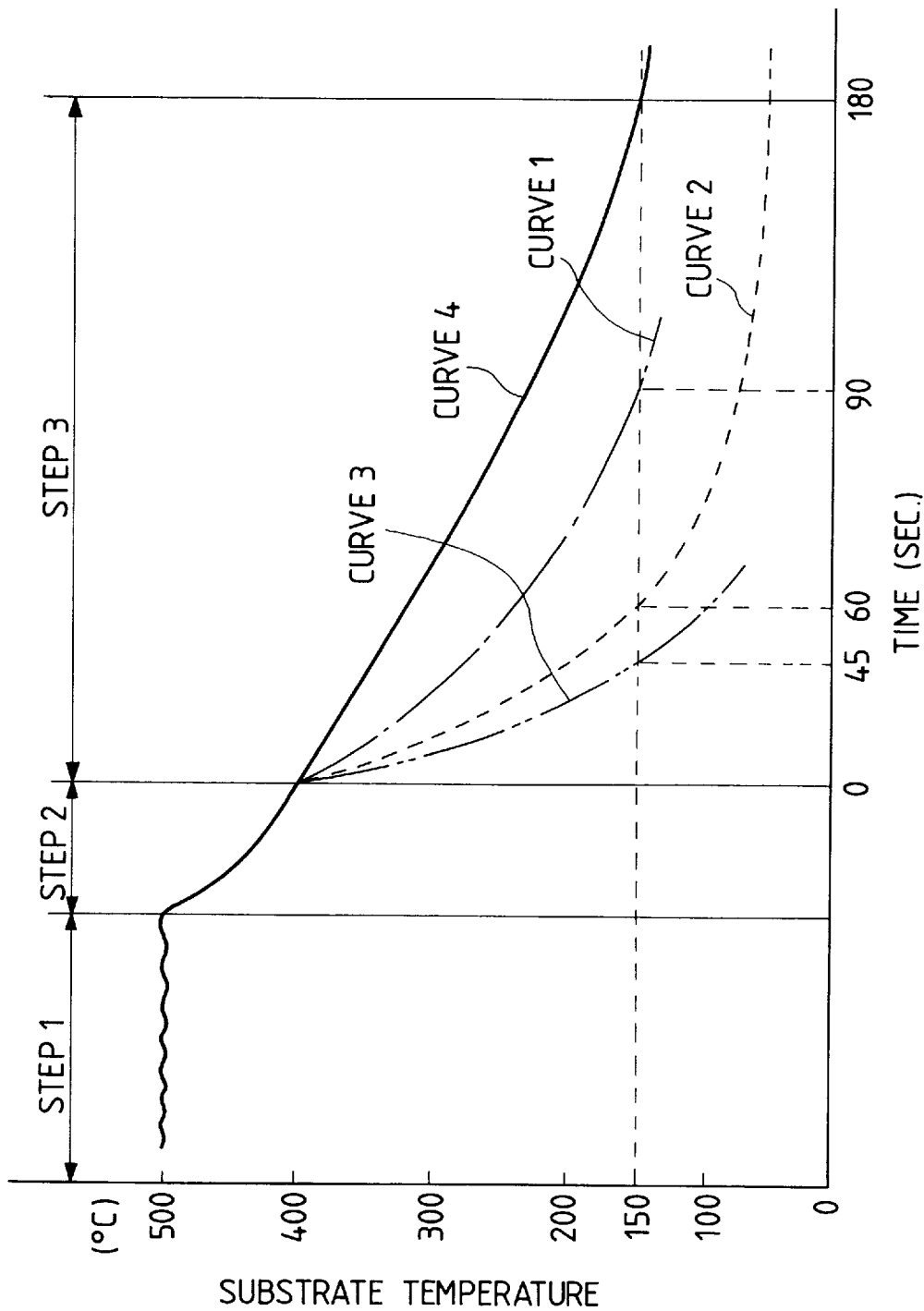
FIG. 11 is a graph showing results of measurements of the variation of the substrate temperature in a comparison of the configuration of examples of the invention and that of the conventional example.

FIG. 11 is a graph showing results of measurements of the variation of the substrate temperature in the comparison. In FIG. 11, step 1 indicates the substrate temperature during sputtering, step 2 indicates that during a period when sputtering has been terminated and the transfer operation is now conducted, and step 3 indicates that in the unload-lock chamber 3. Curve 1 in FIG. 11 shows the temperature change in the case where a cooling stage of the type A was used, curve 2 shows that in the case where a cooling stage of the type B was used, curve 3 shows that in the case where a cooling stage of the type C was used, and curve 4 shows that in the case where, in the same manner as the conventional apparatus, a cooling stage is not used and a substrate is simply allowed to stand in the unload-lock chamber 3.

As seen from the curves 1, 2, and 3 of FIG. 11, in the configurations of the examples using the cooling stage, the substrate temperature is rapidly lowered so that a substrate is cooled to a desired temperature (for example, 150° C.) for a short time period. In contrast, as seen from the curve 4, in the configuration of the conventional apparatus, the substrate temperature is slowly lowered and a substantially long time period must elapse before the temperature is lowered to the fixed one. This seems to be caused by the following reason. In the unload-lock chamber 3 of the vacuum environment, the natural cooling of a substrate is attained only by radiation. Therefore, the conventional configuration is extremely inferior in cooling efficiency to the configurations of the examples which utilize conduction.

As described above, according to the invention, variation of the film quality which is caused by making contact the film with atmosphere after sputtering can be suppressed, and the film properties can be stabilized.

What is claimed is:

1. A sputtering apparatus comprising:
    a sputter chamber which has a vacuum pump system and which deposits a thin film on a substrate by means of sputtering;
    heating means, disposed in said sputter chamber, for heating the substrate to a first temperature during sputtering;
    an unload-lock chamber which has a vacuum pump system and a vent gas introducing system;
    a cooling stage, disposed in said unload-lock chamber, for making surface contact with the substrate which has been subjected to sputtering and taken out from said sputter chamber so as to cool the substrate to a second temperature; and
    a substrate cassette disposed directly above the cooling stage and in the unload-lock chamber for housing a plurality of substrates cooled by the cooling stage and vertically arranging said plurality of substrates.

2. The sputtering apparatus according to claim 1, wherein said second temperature is in a range from 100° C. to 150° C.

3. The sputtering apparatus according to claim 1, further comprising a noncontact thermometer which measures said second temperature of the substrate making surface contact with said cooling stage, in a noncontact manner.

4. The sputtering apparatus according to claim 1, wherein said sputtering apparatus further comprises a transferring mechanism which places said substrate taken out from said sputter chamber, on said cooling stage and which then transfers said substrate from said cooling stage to said substrate cassette and houses said substrate in said substrate cassette.

5. The sputtering apparatus according to claim 3, wherein said sputtering apparatus further comprises a transferring mechanism which places said substrate taken out from said sputter chamber, on said cooling stage and which then transfers said substrate from said cooling stage to said substrate cassette to house said substrate in said substrate cassette; and a control unit which controls an operation of said transferring mechanism, said control unit controlling said transferring mechanism so as to conduct transfer from said cooling stage to said substrate cassette in accordance with a result of a measurement of said second temperature of said substrate by means of said noncontact thermometer.

6. The sputtering apparatus according to claim 4, further comprising a control unit which controls an operation of said transferring mechanism, said control unit controlling said transferring mechanism for placing a substrate.

7. The sputtering apparatus according to claim 1, wherein said cooling stage comprises an electrostatic chucking mechanism which causes the substrate to be attracted to a surface of said cooling stage by means of electrostatic attraction.

8. The sputtering apparatus according to claim 7, wherein said electrostatic chucking mechanism comprises a dielectric block connected to a substrate-placing face of said cooling stage, a pair of chucking electrodes embedded in said dielectric block, and a chucking power source for applying a voltage to said chucking electrodes.

9. The sputtering apparatus according to claim 1, wherein said cooling stage comprises a clamping mechanism which enhances the surface contact between a surface of said cooling stage and a rear face of the substrate.

10. The sputtering apparatus according to claim 9, wherein said clamping mechanism comprises an annular clamper of a size corresponding to an outer diameter of the substrate, and a driving mechanism for driving said clamper.

11. The sputtering apparatus according to claim 1, wherein said cooling stage comprises cooling gas introducing means for introducing a cooling gas causing the cooling gas to make contact with a rear face of the substrate.

12. The sputtering apparatus according to claim 11, wherein said cooling gas introducing means comprises a groove into which the cooling gas is to be introduced, said groove being formed in an upper face of said cooling stage, a communication hole which communicates with said groove and which is passed through said cooling stage, and a pipe which is connected to said communication hole to supply the cooling gas.

13. The sputtering apparatus according to claim 11, wherein said cooling gas introducing means comprises a recess into which the cooling gas is to be introduced, said recess being formed in an upper face of said cooling stage, a communication hole which communicates with said recess and which is passed through said cooling stage, and a pipe which is connected to said communication hole to supply the cooling gas.

14. A sputtering apparatus comprising:
    a sputter chamber which has a vacuum pump system and which successively deposits a thin film on a plurality of substrates by means of sputtering, said substrates being classified into a first group and a second group where said second group is subjected to sputtering after said first group;

heating means, disposed in said sputter chamber, for successively heating the substrates to a first temperature during sputtering;

an unload-lock chamber which has a vacuum pump system and a vent gas introducing system;

a cooling stage, disposed in said unload-lock chamber, for making surface contact with only said second group of substrates which have been subjected to sputtering and taken out from said sputter chamber so as to cool said second group of substrates to a second temperature;

a substrate cassette disposed above the cooling stage and in the unload-lock chamber for housing said plurality of substrates;

a transfer mechanism for transferring said plurality of substrates to said cassette; and a control unit for controlling said transfer mechanism so that (1) said first group of said substrates is transferred directly from said sputter chamber to said substrate cassette, and (2) said second group of said substrates is transferred from said sputter chamber first to said cooling stage and then to said substrate cassette.

15. The sputtering apparatus of claim 14, wherein each of said first and second groups includes at least one substrate.

* * * * *